United States Patent
Xiang et al.

(10) Patent No.: US 6,602,781 B1
(45) Date of Patent: Aug. 5, 2003

(54) METAL SILICIDE GATE TRANSISTORS

(75) Inventors: Qi Xiang, San Jose, CA (US); Paul R. Besser, Austin, TX (US); Matthew Buynoski, Palo Alto, CA (US); John C. Foster, Mountain View, CA (US); Paul L. King, Mountain View, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 81 days.

(21) Appl. No.: 09/734,207

(22) Filed: Dec. 12, 2000

(51) Int. Cl.[7] ................................. H01L 21/44
(52) U.S. Cl. .............. 438/655; 438/287; 438/591; 438/592; 438/656; 438/660; 438/664; 438/685
(58) Field of Search ................. 438/592, 197, 438/585, 586, 595, 596, 769, 775, 791, 680, 777, 287, 591, 593, 594, 655, 656, 660–664, 685

(56) References Cited

U.S. PATENT DOCUMENTS 5,960,270 A * 9/1999 Misra et al. ................ 438/197
6,074,919 A * 6/2000 Gardner et al. ............. 438/287
6,087,231 A * 7/2000 Xiang et al. ................ 438/287
6,255,203 B1 * 7/2001 Cheng et al. ............... 438/592
6,348,420 B1 * 2/2002 Raaijmakers et al. ....... 438/769

OTHER PUBLICATIONS

Book: Silicon Processing For The VLSI Era vol. 1; pp. 399 to 401: Process Integration Author: Stanley Wolf Ph.D. Published by Lattice Press 1986.*

* cited by examiner

Primary Examiner—Amir Zarabian
Assistant Examiner—Christy Novacek

(57) ABSTRACT

A method for implementing a self-aligned metal silicide gate is achieved by confining a metal within a recess overlying a channel and annealing to cause metal and its overlying silicon to interact to form the self-aligned metal silicide gate. A gate dielectric layer formed of oxynitride or a nitride/oxide stack is formed on the bottom and sidewalls of the recess prior to depositing the silicon. The metal is removed except for the portion of the metal in the recess. A planarization step is performed to remove the remaining unreacted silicon by chemical mechanical polishing until no silicon is detected.

27 Claims, 5 Drawing Sheets

METAL SILICIDE GATE TRANSISTORS

RELATED APPLICATIONS

The present invention contains subject matter similar to that disclosed in U.S. application Ser. No. 09/691,181, filed on Oct. 19, 2000; U.S. application Ser. No. 09/731,031, filed on Dec. 7, 2000; U.S. application Ser. No. 09/734,189, filed on Dec. 12, 2000; U.S. application Ser. No. 09/734,185, filed on Dec. 8, 2000; and U.S. application Ser. No. 09/734,186, filed on Dec. 8, 2000.

FIELD OF THE INVENTION

The present invention relates to semiconductor manufacturing technology, more particularly to a method for fabricating field effect transistors by a self-aligned metal silicide gate.

BACKGROUND OF THE INVENTION

Over the last few decades, the electronics industry has undergone a revolution by various efforts to decrease the size of device elements formed in integrated circuits (IC), and such efforts have contributed in increasing the density of circuit elements and device performance. A large variety of semiconductor devices have been manufactured having various applications in numerous disciplines.

Currently, the most common and important semiconductor technology presently used is silicon-based, and the most preferred silicon-based semiconductor device is a MOS (Metal Oxide Semiconductor) transistor. The principal elements of a typical MOS transistor generally comprise a semiconductor substrate on which a gate electrode is disposed. The gate electrode is typically a heavily doped conductor to which an input signal is typically applied via a gate terminal. Heavily doped active regions, e.g., source/drain regions, are formed in the semiconductor substrate and are connected to source/drain terminals. A channel region is formed in the semiconductor substrate beneath the gate electrode and separates the source/drain regions. The gate electrode is generally separated from the semiconductor substrate by a dielectric layer, e.g., an oxide layer, to prevent current from flowing between the gate electrode and the source/drain regions or channel regions.

Conventional process steps for fabricating a typical MOS transistor are depicted in FIGS. 1 to 8. First, as depicted in FIG. 1, an oxide layer is thermally grown on a semiconductor substrate 10, i.e., typically silicon, and a conductive layer, typically polysilicon, is formed over the oxide layer. The oxide layer and conductive layer are patterned and etched to form gate dielectric 12 and gate electrode 14, respectively. Then, as depicted in FIG. 2, impurity atoms, e.g., boron or phosphorus, are ion implanted into the surface of the silicon substrate 10, by utilizing the gate electrode 14 as a mask, to form shallow source/drain regions 16 on the main surface of the silicon substrate 10.

The ion implantation step is followed by an annealing step which normally involves a high temperature of 700° C. or higher to activate the implanted impurity atoms in the shallow source/drain regions 16 and to cure the damage caused by the physical impact to the crystal structure of the silicon substrate 10 when the impurity atoms are implanted thereto. Sidewall spacers 18 are then formed on the side surfaces of the gate dielectric 12 and gate electrode 14, as depicted in FIG. 3.

Subsequently, source/drain regions 20 are formed by ion implanting impurity atoms, e.g., boron or phosphorus, at the impurity implantation concentration and energy higher than those from the first annealing process, by utilizing the gate electrode 14 and the sidewall spacers 18 as a mask, as depicted in FIG. 4. Once again, the annealing process is performed at a high temperature of 700° C. or higher to activate the implanted impurity atoms in the source/drain regions 20 and to cure the damage caused by the implantation impact.

As transistor dimensions approached one micron in diameter, conventional parameters resulted in intolerably increased resistance between the active region 20 and conductive interconnect lines formed subsequently to interconnect various device elements in the integrated circuit device. The principle way of reducing such contact resistance is by forming a metal silicide atop the source/drain regions 20 and the gate electrodes 14 prior to application of the conductive film for formation of the various conductive interconnect lines. The most common metal silicide materials are $CoSi_2$ and $TiSi_2$.

As depicted in FIG. 5, a metal layer 22 is typically provided by first applying a thin layer of, for example, titanium, atop the wafer which contacts the source/drain regions 20. Then, the wafer is subjected to one or more annealing steps at the temperature of 800° C. or higher. This causes the titanium layer 22 to selectively react with the silicon of the source/drain regions 20 and the gate electrodes 14, thereby forming a metal silicide ($TiSi_2$) layer 24 selectively on the source/drain regions and the gate electrodes 14. Such a process is referred to as a salicide (self-aligned silicide) process because the $TiSi_2$ layer 24 is formed only where the titanium material directly contacts the silicon source/drain regions 20 and the polycrystalline silicon gate electrode 14. Following the formation of the silicide layer 24, as depicted in FIG. 7, an interlayer dielectric film 26 is deposited over the entire surface of the substrate 10, and an interconnect process is performed (not shown) to provide conductive paths by forming via holes through the interlayer dielectric 26 and filling the via holes with a conductive material, e.g., tungsten.

As the dimensions of the MOS transistor are further scaled down to submicron and nanometer dimensions, the thickness of the gate oxide is also scaled down accordingly. However, such excessively reduced thickness of the gate oxide causes charge carrier leakage by tunneling effect, thereby leading to faster degradation of the MOS transistor.

To solve this problem, a high k (dielectric constant) gate dielectric, e.g., $ZrO_2$, $HfO_2$, $InO_2$, $LaO_2$, $TaO_2$, was introduced to replace the silicon oxide for submicron MOS devices. However, it has been also observed that the high k gate dielectric becomes thermally unstable during the high temperature process steps for fabrication of the MOS transistor. For example, as mentioned above, the source/drain region activation annealing steps in FIGS. 2 and 4 and the silicidation step in FIG. 6 are normally performed at a temperature of at least 700° C. or higher, or in some cases at a temperature of 1000° C. or higher. At such a high temperature, tantalum oxide ($Ta_2O_5$), another high k gate dielectric, is transformed from amorphous to crystalline, which causes charge carrier leakage. In addition, at such a high temperature, tantalum oxide undesirably interacts with the underlying silicon substrate or overlying polysilicon gate electrode of the MOS transistor.

To solve this problem, a metal gate electrode has been introduced to avoid the reaction between the high k gate dielectric and the polysilicon gate electrode during the high temperature processing steps. For example, as described in the U.S. Pat. No. 5,960,270 by Misra, et al. a metal deposition process was proposed to form a metal gate layer by depositing molybdenum, tungsten, tungsten silicide, nickel silicide, or titanium nitride. However, it has been also observed that the metal atoms from the gate electrode diffuse into the gate dielectric, thereby causing faster degradation of the high k gate dielectric, and both the high k gate dielectric and the metal gate electrode suffer structural stress from such high temperature process steps. Also, since the metal or metal silicide layer is deposited entirely over the semiconductor structure, it has been observed that it is difficult to controllably remove the unnecessary portions of the deposited metal or metal silicide layer to shape a metal or metal silicide gate due to the material unity.

Thus, there is a continuing need for improved methods that enable implementation of a reliable gate structure in submicron MOS transistors without the undesirable side effects and complicated process steps.

SUMMARY OF THE INVENTION

These and other needs are met by the present invention that provides a method for forming a self-aligned metal silicide gate on a gate dielectric formed of oxynitride or a nitride/oxide stack within semiconductor structures. The method includes forming a precursor having a substrate with active regions separated by a channel, and a temporary gate over the channel and between dielectric structures. The temporary gate is removed to form a recess with a bottom and sidewalls between the dielectric structures. A gate dielectric formed of oxynitride or a nitride/oxide stack is formed in the recess on the bottom and sidewalls. A metal is deposited over the semiconductor structure and the metal is removed except for a portion in the recess. Amorphous silicon is formed over the semiconductor structure, and annealing is performed to cause the amorphous silicon and the portion of the metal in the recess to react to form a self-aligned metal silicide gate. Finally, the amorphous silicon remaining unreacted after the annealing is removed by planarization from the semiconductor structure.

Hence, in accordance with an aspect of the present invention, the metal deposited over the semiconductor structure is removed except for a portion in the recess, which enables the portion in the recess to selectively interact with the overlying amorphous silicon, thereby forming the self-aligned metal silicide gate selectively within the recess. Since the silicidation between the silicon and the metal occurs selectively in the recess, and other portions of the metal remain unchanged, the remaining portions of the amorphous silicon can be easily removed, by planarization, for example. Also, since the dielectric is formed of oxynitride or a nitride/oxide stack, which is less likely to become unstable during a high temperature silicidation process, the silicidation process needs not be performed below a certain temperature, e.g., 600° C. to ensure the reliability of conventional silicon oxide or high k gate dielectrics, and therefore a wider range of metal materials can be selected to form the metal silicide gate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The method steps described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of a semiconductor chip or a substrate during fabrication are not drawn to scale, but instead are drawn to illustrate the feature of the present invention.

The present invention provides a method for implementing a self-aligned metal silicide gate on a gate dielectric formed of oxynitride or a nitride/oxide stack without the problems of conventional silicon oxide or high k gate dielectrics and polysilicon or metal gate electrodes in conventional methods. This is achieved by using dummy gate techniques to confine a metal within a recess formed over a channel and annealing to cause the metal and its overlying amorphous silicon to react to form a self-aligned metal silicide gate. Since the removal of the metal except for the portion in the recess is performed prior to the silicidation process, the remaining unreacted portions of the amorphous silicon can be easily removed, by planarization, e.g., chemical mechanical polishing. Also, since the dielectric is formed of oxynitride or a nitride/oxide stack, which is less likely to become unstable during a high temperature silicidation process, the silicidation process needs not to be performed below a certain temperature, e.g., 600° C. to ensure the reliability of conventional silicon oxide or high k gate dielectrics, and therefore a wider range of metal materials can be selected to form the metal silicide gate.

Figure 8:
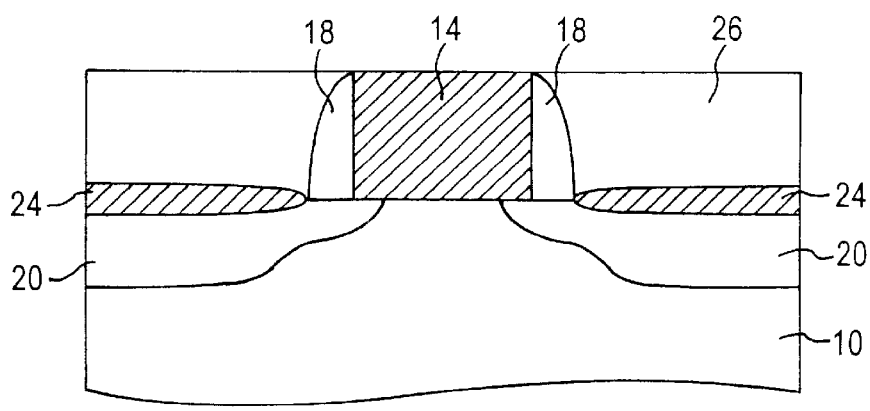
FIG. 8 is a schematic depiction of a cross-section of a semiconductor structure precursor in accordance with embodiments of the present invention.

With this in mind, FIG. 8 is a cross-section of a precursor for the semiconductor structure constructed in accordance with embodiments of the present invention. In FIG. 8, a silicon substrate 10 has active regions 20 formed therein by conventional ion implantation and subsequent annealing techniques. A silicide layer 24 is formed atop the active regions 20 to reduce the resistance between the active regions 20 and conductive interconnect lines which will be formed subsequently.

A polysilicon gate 14, which serves as a temporary gate, is provided on top of the channel. Sidewall spacers 18 are provided on the sidewalls of the gate 14, and interlayer dielectric 26 is provided to cover the active regions 20 and the silicide layer 24. Although it is not shown, if necessary, a silicon oxide gate dielectric could be formed between the substrate 10 and the gate 14.

Figure 9:
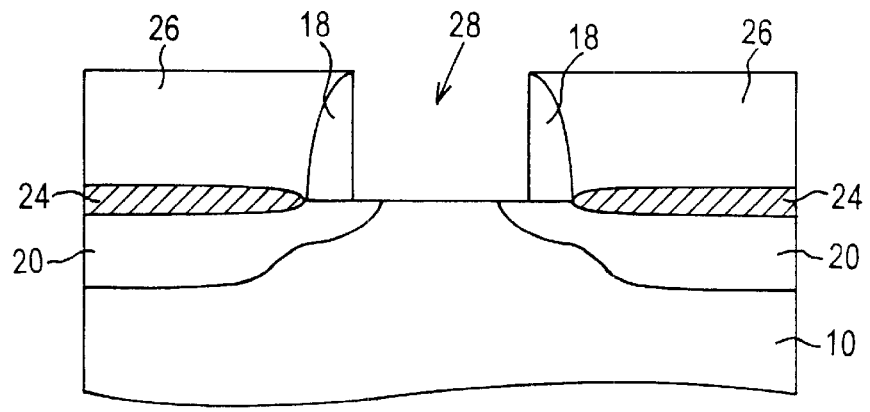
FIG. 9 depicts the portion of FIG. 8, after the temporary gate electrode has been removed to form a recess.

In FIG. 9, the temporary gate 14 is removed from the region between the sidewall spacers 18. A plasma reactive ion etch (RIE) using chlorine or a wet polysilicon etch using conventional etch chemistry may be utilized to remove the polysilicon gate 14 to form an opening (i.e., recess) 28.

Figure 10:
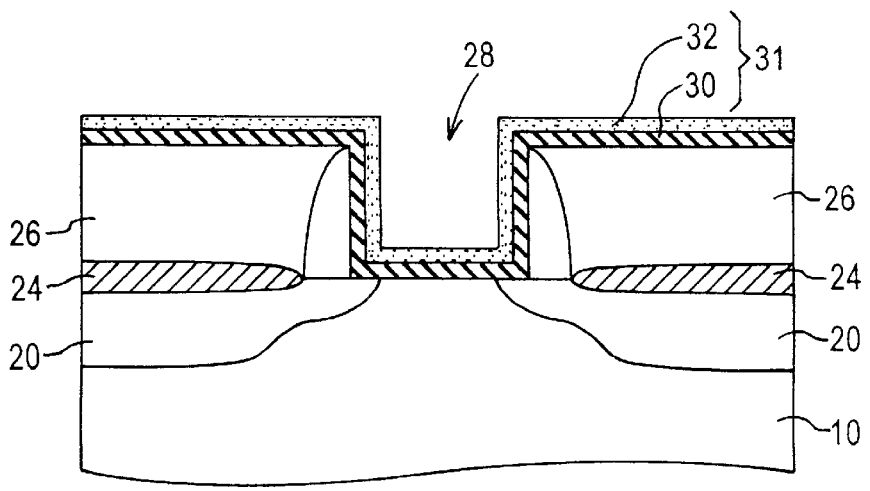
FIG. 10 depicts the portion of FIG. 9, after a gate dielectric formed of oxynitride or a nitride/oxide stack has been deposited on the surfaces of the recess and over the interlayer dielectric layer.

Subsequently, as depicted in FIG. 10, a dielectric layer is formed over the semiconductor structure, particularly on the bottom of the recess 28 to form a gate dielectric 31. The gate dielectric 31 is either a stack of nitride/oxide layers 32, 30, as particularly depicted in FIG. 10, or an oxynitride layer. The gate dielectric layer 31 has the thickness between approximately 10 Å and approximately 25 Å, for example.

The oxynitride gate dielectric can be formed by conventional thermal growth or chemical vapor deposition (CVD). For example, oxynitride is thermally grown in a $N_2O$, NO or $NH_3$ ambient at a temperature between approximately 700° C. and approximately 1000° C. for a period between approximately 30 seconds and approximately 90 seconds. In another aspect of the invention, the stack of nitride/oxide layers 32, 30 can be formed by thermally growing oxynitride 30 at the thickness between approximately 5 Å and approximately 8 Å over the semiconductor structure, particularly on the bottom of the recess 28, and subsequently depositing silicon nitride 32 over the oxynitride layer 30 by a chemical vapor deposition (CVD). As previously mentioned, a reason for using oxynitride or a silicon nitride/oxynitride stack is that conventional silicon dioxide is no longer extendable and a high k gate dielectric becomes unstable during the subsequent high temperature process steps.

Figure 1:
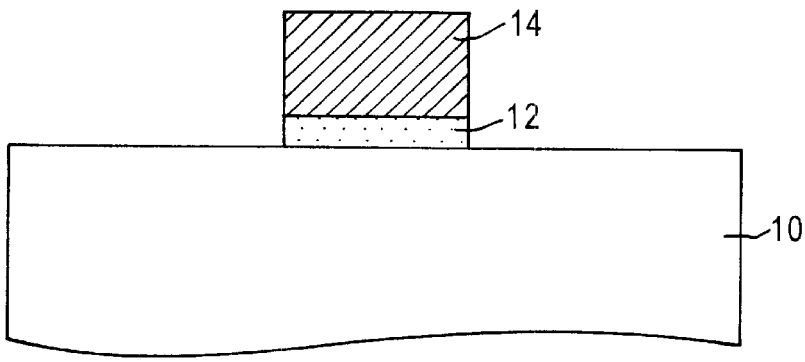
FIG. 1 is a schematic depiction of a cross-section of a prior art semiconductor structure, in which a gate electrode is formed on a semiconductor substrate with a gate oxide therebetween.
Figure 2:
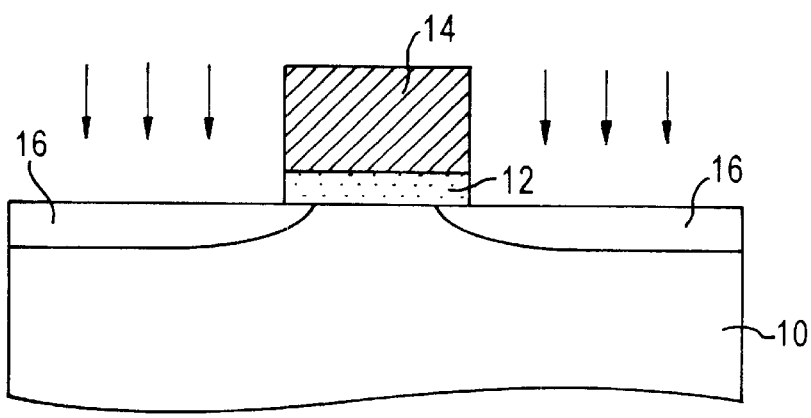
FIG. 2 depicts the portion of FIG. 1, during the first ion implantation process to form shallow source and drain regions on the main surface of the substrate.
Figure 3:
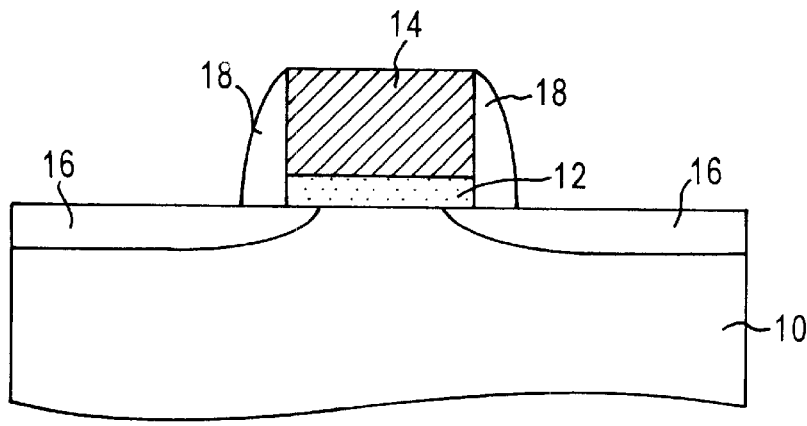
FIG. 3 depicts the portion of FIG. 2, after the first annealing process and a sidewall spacer formation process.
Figure 4:
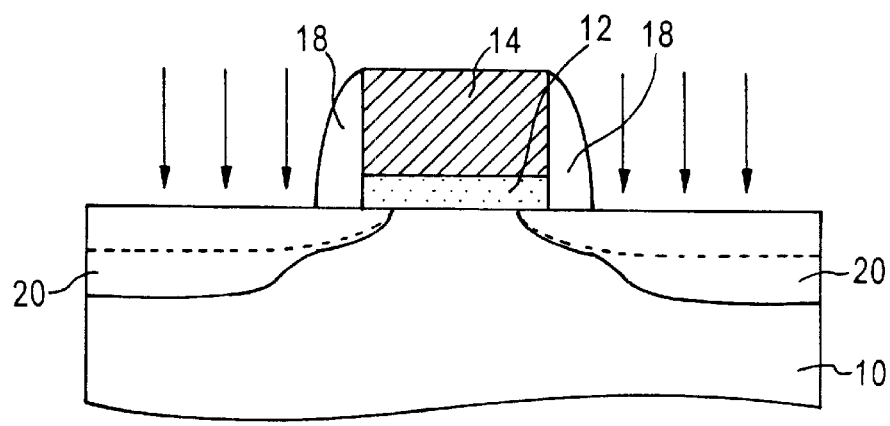
FIG. 4 depicts the portion of FIG. 3, during the second ion implantation process to form source and rain regions on the main surface of the substrate.
Figure 5:
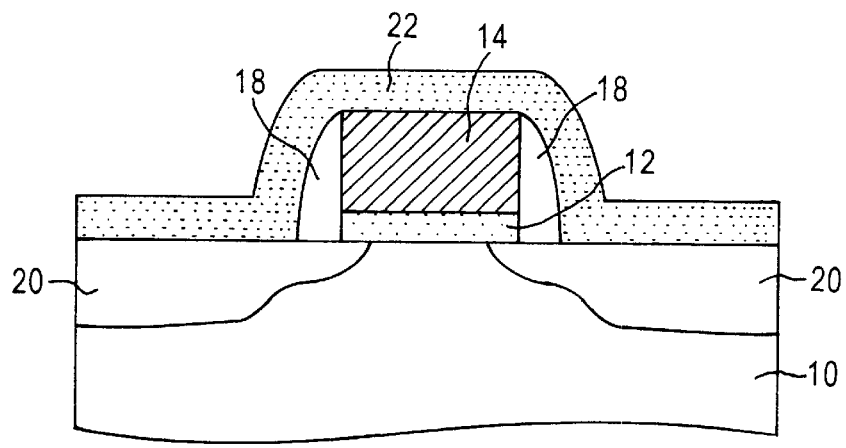
FIG. 5 depicts the portion of FIG. 4, after the second annealing process and a metal layer deposition process.
Figure 6:
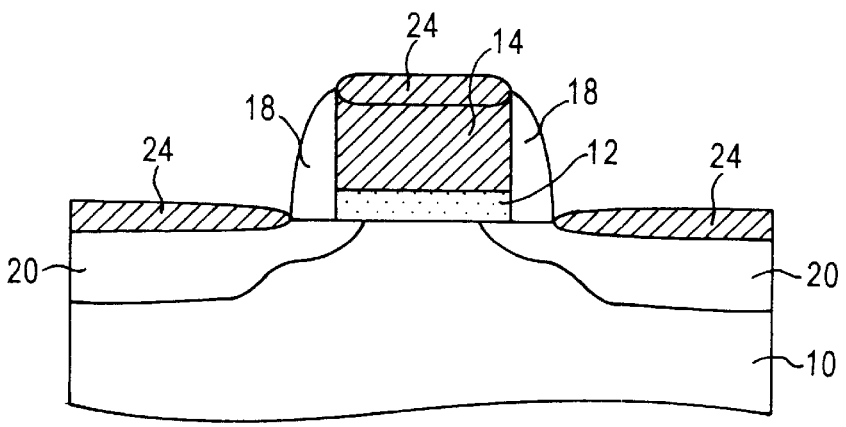
FIG. 6 depicts the portion of FIG. 5, after a silicidation process to form a metal silicide layer on the source and drain regions and the gate electrode.
Figure 7:
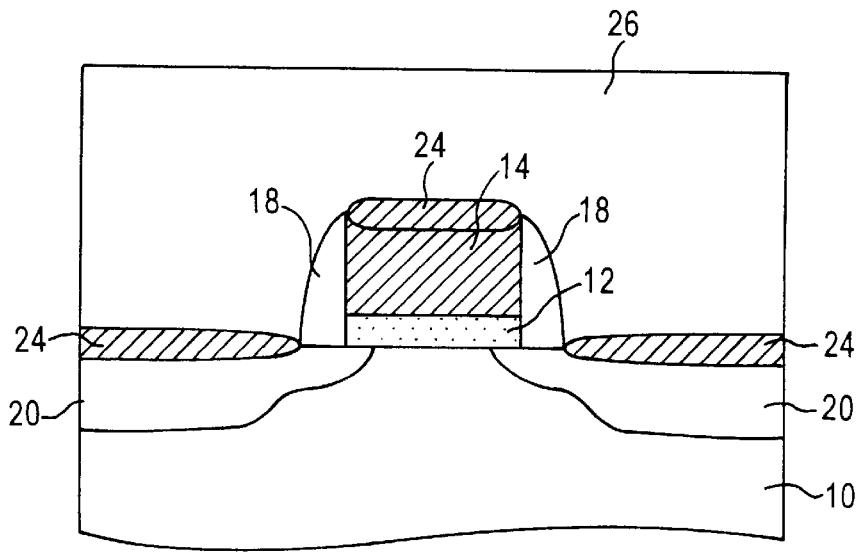
FIG. 7 depicts the portion of FIG. 6, after an interlayer dielectric layer formation.
Figure 11:
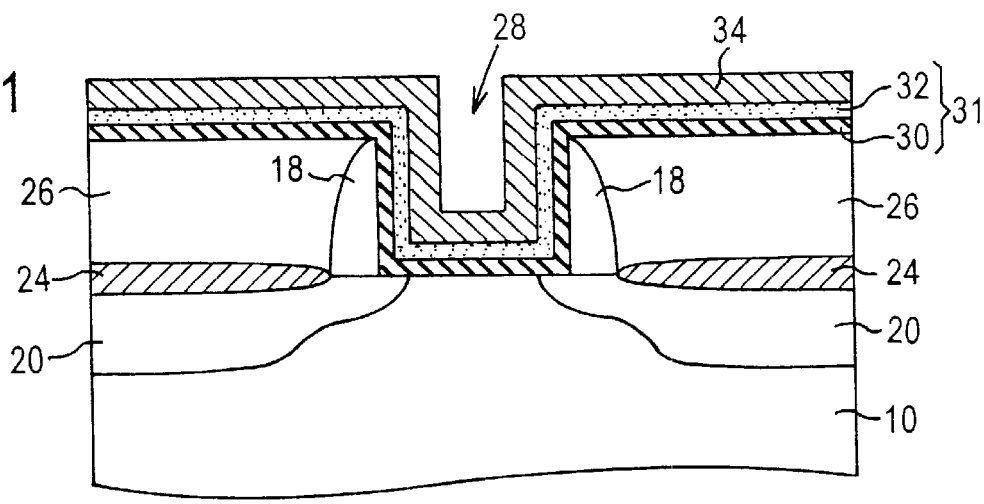
FIG. 11 depicts the portion of FIG. 10, after a metal has been deposited over the gate dielectric.

FIG. 11 depicts the semiconductor structure of FIG. 3, after deposition of a metal layer 34. For example, the metal layer 34 is provided within the recess 28 on top of the gate dielectric layer 31 by conventional chemical vapor deposition (CVD), for example, a plasma enhanced chemical vapor deposition (PECVD) at a thickness between approximately 500 Å and approximately 1500 Å. Since the gate dielectric 31 endures and does not become unstable during high temperature process steps, a wide range of silicide metal materials can be used, for example, tungsten, titanium, manganese, cobalt, yttrium, platinum or palladium, thereby not limited to low temperature silicidation metals, e.g., nickel.

Figure 12:
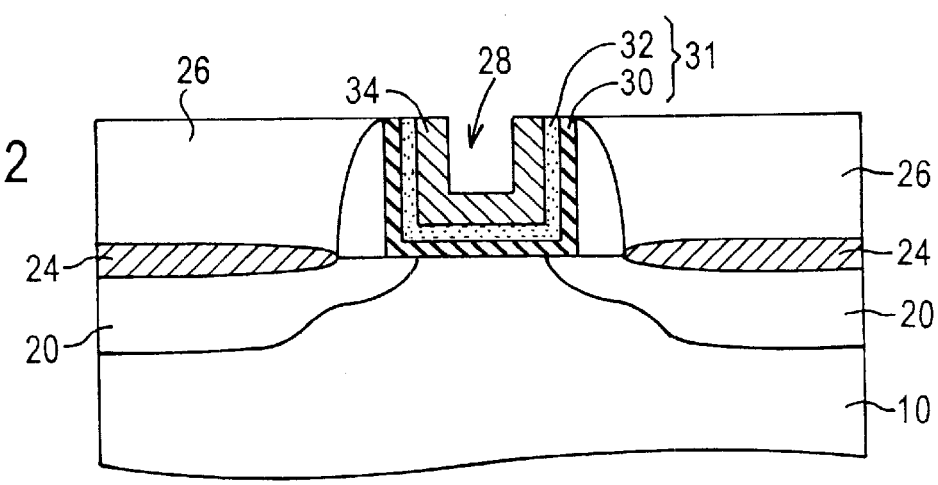
FIG. 12 depicts the portion of FIG. 11, after the metal has been removed except for the portion in the recess.

Following the deposition of the metal 34, as depicted in FIG. 12, the semiconductor structure of FIG. 11 is planarized, by chemical mechanical planarization (CMP), for example, to remove the metal layer 34 and the gate dielectric 31 except for the portion within the recess 28. As will be described hereafter, by confining the metal 34 within the recess 28, a self-aligned silicidation is achieved.

Figure 13:
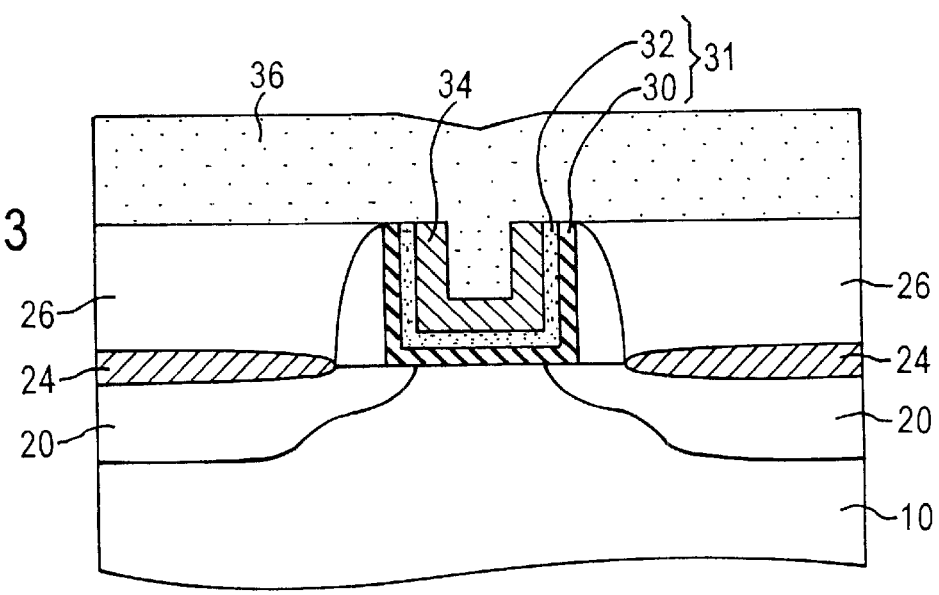
FIG. 13 depicts the portion of FIG. 12, after amorphous silicon has been deposited over the entire semiconductor structure.
Figure 14:
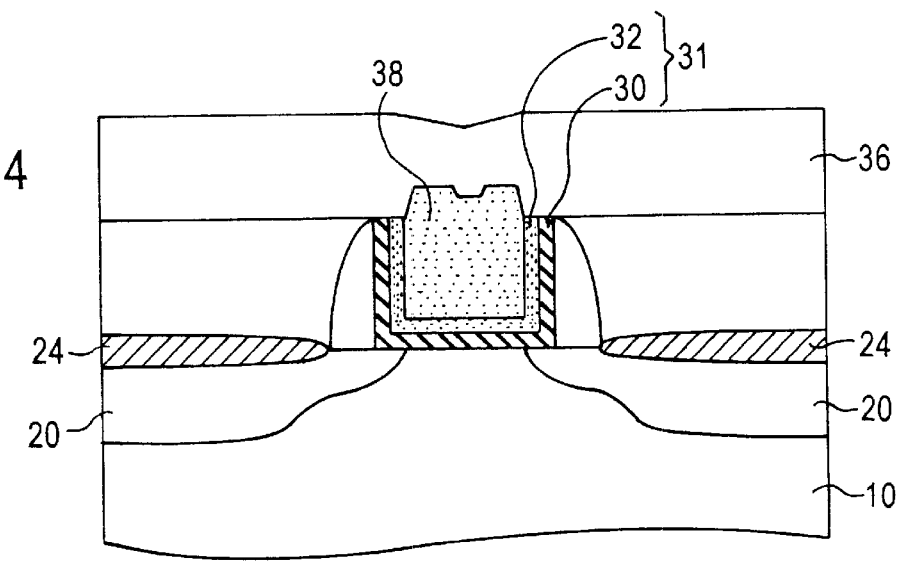
FIG. 14 depicts the portion of FIG. 13, after annealing has been performed to form a self-aligned silicide gate over the channel.

In FIG. 13, amorphous silicon is provided as layer 36 having a thickness between approximately 1000 Å and approximately 2000 Å. Subsequently, in FIG. 14, annealing is performed to convert the metal 34 confined in the recess 28 to self-aligned silicide 38. Since the amorphous silicon 36 is in limited contact with the metal layer 34 over the recess 28, the self-aligned silicide metal gate 38, e.g., tungsten silicide, titanium silicide, nickel silicide, manganese silicide, cobalt silicide, yttrium silicide, platinum silicide or palladium silicide, is selectively formed over the gate dielectric 31, particularly within the recess 28. Other portions of the amorphous silicon 36, which are not in contact with the amorphous silicon 34, remain unchanged. The annealing may be performed by conventional rapid thermal annealing at a temperature between approximately 400° C. and approximately 800° C. for a period of between approximately 20 seconds and approximately 60 seconds. As previously mentioned, since the gate dielectric layer formed of oxynitride or a nitride/oxynitride stack remains stable at the temperature approximately 600° C. or higher, a wide range of silicidation metals can be selected to form metal silicide gate electrodes.

Figure 15:
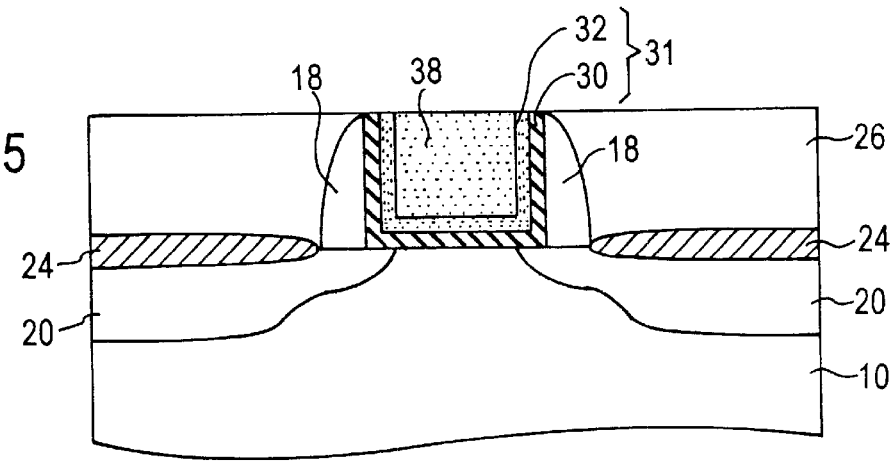
FIG. 15 depicts the portion of FIG. 13, after the semiconductor structure has been planarized to remove the amorphous silicon.

In FIG. 15, the remaining unreacted portion of the amorphous silicon 36 is removed by conventional planarization techniques, e.g., chemical mechanical polishing (CMP) by utilizing the material difference between the metal silicide gate 38 and the silicon layer 36. Since the silicide metal gate 38 is selectively formed over the gate dielectric 31, not entirely deposited over the entire upper surface of the semiconductor structure including the recess, the planarization step can performed with less complexity, by chemical mechanical polishing, until no silicon is detected, thereby automatically shaping the silicide metal gate 38.

Thus, the present invention enables implementation of a self-aligned metal silicide gate over a dielectric film, by manipulating the material difference between a metal silicide gate and silicon overlying the metal silicide gate. In accordance with the present invention, the silicidation occurs at the necessary areas, thereby avoiding silicidation of the entire upper surface of the semiconductor structure. This enables easier formation of the metal silicide gate, simply by planarizing the unreacted silicon, until no silicon is detected. Also, since the gate dielectric is formed of oxynitride or a nitride/oxide stack, which is less likely to become unstable during a high temperature silicidation process, the silicidation process needs not be performed below a certain temperature, e.g., 600° C. to ensure the reliability of conventional silicon oxide or high k gate dielectrics, and therefore a wider range of metal materials can be selected to form the metal silicide gate.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for forming a semiconductor structure comprising the steps of:
    forming a precursor having a substrate with active regions separated by a channel, and a temporary gate over the channel and between dielectric structures;
    removing the temporary gate to form a recess with a bottom and sidewalls between the dielectric structures;
    depositing a gate dielectric formed of oxynitride in the recess on the bottom and sidewalls;
    depositing a metal over the gate dielectric and on the dielectric structures;
    removing the metal except for a portion in the recess;
    depositing amorphous silicon over the metal and on the dielectric structures;
    annealing to cause the amorphous silicon and the portion of the metal in the recess to react to form a self-aligned metal suicide gate; and
    planarizing to remove the amorphous silicon on the dielectric structures.

2. The method of claim 1, wherein a thickness of the gate dielectric is between approximately 10 Å and approximately 25 Å.

3. The method of claim 1, wherein the oxynitride gate dielectric is formed by a thermal growth or chemical vapor deposition (CVD).

4. The method of claim 3, wherein the oxynitride gate dielectric is formed by the thermal growth in a $N_2O$, NO or $NH_3$ ambient at a temperature between approximately 700° C. and approximately 1000° C. for a period of between approximately 30 seconds and approximately 90 seconds.

5. The method of claim 1, wherein the metal is W, Ti, Ni, Mn, Co, Y, Pt or Pd.

6. The method of claim 5, wherein the metal is deposited by a chemical vapor deposition (CVD).

7. The method of claim 6, wherein the chemical vapor deposition is a plasma enhanced chemical vapor deposition (PECVD).

8. The method of claim 1, wherein the metal is removed by a chemical mechanical polishing (CMP).

9. The method of claim 8, wherein the gate dielectric is removed by the chemical mechanical polishing except for a portion within the recess.

10. The method of claim 1, wherein the amorphous silicon is deposited by a chemical vapor deposition (CVD).

11. The method of claim 1, wherein the annealing is performed by a rapid thermal anneal at a temperature between approximately 400° C. and approximately 800° C. for a period between approximately 20 seconds and approximately 60 seconds.

12. The method of claim 1, wherein the planarizing is by a chemical mechanical polishing (CMP).

13. The method of claim 1, wherein the dielectric structures are an interlayer dielectric.

14. A method for forming a semiconductor structure comprising the steps of:
    forming a precursor having a substrate with active regions separated by a channel, and a temporary gate over the channel and between dielectric structures;
    removing the temporary gate to form a recess with a bottom and sidewalls between the dielectric structures;
    depositing a gate dielectric formed of a nitride/oxide stack in the recess on the bottom and sidewalls;
    depositing a metal over the gate dielectric and on the dielectric structures;
    removing the metal except for a portion in the recess;
    depositing amorphous silicon over the metals and on the dielectric structures;
    annealing to cause the amorphous silicon and the portion of the metal in the recess to react to form a self-aligned metal silicide gate; and
    planarizing to remove the amorphous silicon on the dielectric structures.

15. The method of claim 14, wherein a thickness of the gate dielectric is between approximately 10 Å and approximately 25 Å.

16. The method of claim 15, wherein the nitride/oxide stack gate dielectric is a stack of oxynitride and silicon nitride formed thereon.

17. The method of claim 16, wherein the step of forming the nitride/oxide gate dielectric comprises the steps of:
    thermally growing the oxynitride over the dielectric structures and in the recess; and
    depositing the silicon nitride on the oxynitride by a chemical vapor deposition (CVD).

18. The method of claim 17, wherein the thickness of the oxynitride layer is between approximately 5 Å and approximately 15 Å, and the thickness of the silicon nitride layer is between approximately 5 Å and approximately 8 Å.

19. The method of claim 14, wherein the metal is W, Ti, Ni, Mn, Co, Y, Pt or Pd.

20. The method of claim 19, wherein the metal is deposited by a chemical vapor deposition (CVD).

21. The method of claim 20, wherein the chemical vapor deposition is a plasma enhanced chemical vapor deposition (PECVD).

22. The method of claim 14, wherein the metal is removed by a chemical mechanical polishing (CMP).

23. The method of claim 22, wherein the gate dielectric is removed by the chemical mechanical polishing except for a portion within the recess.

24. The method of claim 14, wherein the amorphous silicon is deposited by a chemical vapor deposition (CVD).

25. The method of claim 14, wherein the annealing is performed by a rapid thermal anneal at a temperature between approximately 400° C. and approximately 800° C. for a period between approximately 20 seconds and approximately 60 seconds.

26. The method of claim 14, wherein the planarizing is by a chemical mechanical polishing (CMP).

27. The method of claim 14, wherein the dielectric structures are an interlayer dielectric.

* * * * *